(12) United States Patent
Chu et al.

(10) Patent No.: US 11,569,422 B2
(45) Date of Patent: Jan. 31, 2023

(54) SEMICONDUCTOR PACKAGE WITH INTEGRATED OPTICAL DIFFUSER AND FILTER

(71) Applicant: Advanced Semiconductor Engineering, Inc., Kaohsiung (TW)

(72) Inventors: Wei-Tang Chu, Kaohsiung (TW); Tsu-Hsiu Wu, Kaohsiung (TW); Chun Yu Ko, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 183 days.

(21) Appl. No.: 17/016,034

(22) Filed: Sep. 9, 2020

(65) Prior Publication Data

US 2022/0077364 A1 Mar. 10, 2022

(51) Int. Cl.
*H01L 33/60* (2010.01)
*H01L 33/52* (2010.01)
*H01L 31/09* (2006.01)

(52) U.S. Cl.
CPC .............. *H01L 33/60* (2013.01); *H01L 33/52* (2013.01); *H01L 31/09* (2013.01)

(58) Field of Classification Search
CPC .................................. H01L 33/60; H01L 33/52
See application file for complete search history.

(56) References Cited

U.S. PATENT DOCUMENTS

| 2005/0226636 | A1* | 10/2005 | Hiramatsu | H01S 5/02234 |
| | | | | 398/182 |
| 2012/0153323 | A1* | 6/2012 | Hawryluk | G03F 7/70283 |
| | | | | 257/E33.001 |
| 2013/0168720 | A1 | 7/2013 | Biebersdorf et al. | |
| 2014/0203305 | A1* | 7/2014 | Kawano | H01L 33/486 |
| | | | | 438/28 |
| 2018/0269347 | A1* | 9/2018 | Chen | H01L 31/167 |

FOREIGN PATENT DOCUMENTS

CN 102971872 B 9/2015

* cited by examiner

*Primary Examiner* — Jay C Chang
*Assistant Examiner* — Mikka Liu
(74) *Attorney, Agent, or Firm* — Foley & Lardner LLP (57) ABSTRACT

A semiconductor package is provided in the present disclosure. The semiconductor package comprises: a substrate, an electronic device disposed on the substrate, a lid disposed on the substrate and surrounding the electronic device an encapsulant formed over the substrate, encapsulating the electronic device and the lid; and a plurality of fillers in the encapsulant, configured to diffuse light interacting with the electronic device. In this way, through the use of the encapsulant including the fillers distributed therein, additional optical filters and diffusers are not needed. Also, through the use of the lid, undesired stray light can be prevented from being interacting with the electronic device.

10 Claims, 6 Drawing Sheets

SEMICONDUCTOR PACKAGE WITH INTEGRATED OPTICAL DIFFUSER AND FILTER

BACKGROUND

1. Technical Field

The present disclosure relates to a semiconductor package including an integrated optical diffuser and/or an optical filter, and more particularly, to a semiconductor package including an integrated optical diffuser and/or filter and a lid.

2. Description of the Related Art

Semiconductor packages have been widely used for optical sensing electronic devices, such as ambient light sensors, proximity sensors, time of flight (TOF) sensors, 3D structure light sensors and related optical sensors/detectors. These electronic devices are widely used in consumer electronic products.

For such electronic devices, additional optical films such as an optical filter and an optical diffuser, are usually adopted. These optical films, which can be obtained as free-standing pieces on the market, are usually stacked with the semiconductor packages. The addition of the optical films inevitably generates extra cost for the material and the manufacturing process. Also, the stacked structures render the entire module too thick to meet the market demand for thin or small devices.

SUMMARY

In an aspect, a semiconductor package is provided. The semiconductor package comprises: a substrate; an electronic device disposed on the substrate; an encapsulant formed over the substrate and encapsulating the electronic device; and a plurality of fillers in the encapsulant, configured to diffuse light interacting with the electronic device, wherein the plurality of fillers occupy 30% to 70% of a volume of the encapsulant.

In an aspect, a semiconductor package is provided. The semiconductor package comprises: a substrate; an optical detector disposed on the substrate; a lid disposed on the substrate and surrounding the optical detector; and an encapsulant formed over the substrate and encapsulating the optical detector, wherein the lid includes at least one opening.

In an aspect, a semiconductor package is provided. The semiconductor package comprises: a substrate; an electronic device disposed on the substrate; a lid disposed on the substrate and surrounding the electronic device; an encapsulant formed over the substrate, encapsulating the electronic device and the lid; and a plurality of fillers in the encapsulant, configured to diffuse light interacting with the electronic device.

BRIEF DESCRIPTION OF THE DRAWINGS

Aspects of some embodiments of the present disclosure are readily understood from the following detailed description when read with the accompanying figures. It should be noted that various structures may not be drawn to scale, and dimensions of the various structures may be arbitrarily increased or reduced for clarity of discussion.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "top," "bottom," "higher," "lower," "under," and so forth, are indicated with respect to the orientation shown in the figures unless otherwise specified. It should be understood that the spatial descriptions used herein are for purpose of illustration only, and that practical implementations of the structures described herein can be spatially arranged in any orientation or manner, provided that the merits of embodiments of this disclosure are not deviated by such arrangement. As used herein, the singular terms "a," "an," and "the" may include plural referents unless the context clearly dictates otherwise.

To address the issues for the traditional semiconductor packages for the optical electronic devices, according to some embodiments of the present disclosure, a semiconductor package including an integrated optical diffuser and/or filter is provided. Specifically, according to some embodiments of the present disclosure, light filtering packaging material including light diffusing filler particles distributed therein is used so that an additional optical filter and optical diffuser are not needed.

Figure 1:
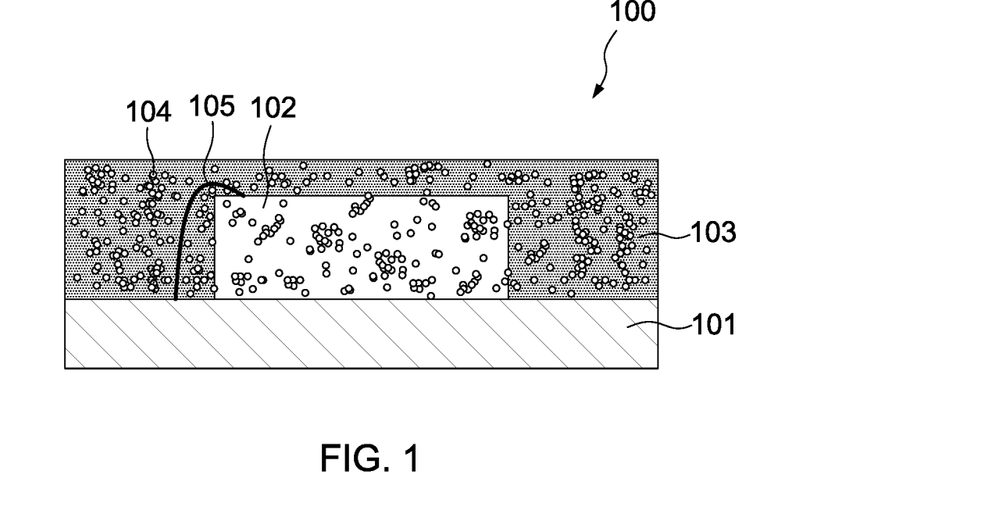
FIG. 1 illustrates a schematic cross-sectional view of a semiconductor package according to some embodiments of the present disclosure.

Referring to FIG. 1, FIG. 1 illustrates a schematic cross-sectional view of a semiconductor package 100 according to some embodiments of the present disclosure. The semiconductor package 100 includes a substrate 101, an electronic device 102, an encapsulant 103, a plurality of fillers 104, and a bonding wire 105. As shown in FIG. 1, the electronic device 102 is disposed on the substrate, the encapsulant 103 is formed over the substrate 101 and the electronic device 102, and the encapsulant 103 encapsulates the electronic device 102. The fillers 104 are uniformly distributed in the encapsulant 103. The bonding wire 105 is connected between the electronic device 102 and the substrate 101.

In some embodiments, the electronic device 102 may be an optical detector or an optical emitter. The encapsulant 103 itself can be used as an optical filter to prevent light of undesired wavelength from interacting with the electronic device 102. The fillers 104 are uniformly distributed in the encapsulant 103 and can be used as an optical diffuser for diffusing incoming lights prior to their entering to the electronic device 102. Thus, the combination of the encapsulant 103 and the fillers 104 can be used as an integrated optical filter and diffuser for the electronic device 102. In some embodiments, to obtain desired light diffusing properties, the fillers 104 may occupy 30% to 70% of a total volume of the encapsulant 103. As referred herein, the 30% to 70% of a total volume of the encapsulant 103 can be determined from a cross section of the semiconductor package 100 as illustrated in FIG. 1, for example, a total area occupies by the fillers 104 is around 30% to 70% of the area occupied by the encapsulant.

In some embodiments, the surface of the substrate 101 may be processed through a treatment to weaken light reflection. In some embodiments, the treatment may be dark-color painting or sand blasting. In some embodiments, the substrate 101 comprises a roughened surface weakening light reflection.

In some embodiments, the encapsulant 103 includes a molding compound. In some embodiments, the encapsulant 103 includes a material which allows transmission of visible light and absorbs near infra-red (NIR) light. In some embodiments, the encapsulant 103 includes a material allowing transmission of light with a wavelength in a rage from about 380 nm to 720 nm and preventing transmission of light with a wavelength in a range of from about 720 nm to 1000 nm. In some embodiments, the encapsulant 103 may include epoxy. In some embodiments, the encapsulant 103 may include epoxy with a refractive index within a range of from about 1.4 to 1.8. In some embodiments, the fillers 104 may include a light scattering material, which has high reflectivity. In some embodiments, the fillers 104 may include aluminum oxide ($Al_2O_3$) or other suitable materials. In some embodiments, the fillers 104 may include particles each having a diameter within a range of from 1 μm to 10 μm.

As the combination of the encapsulant 103 and the fillers 104 can be used as an integrated optical filter and optical diffuser for the electronic device 102, there is no need for an additional optical filter and/or an additional optical diffuser to be stacked on the semiconductor package 100. Thus, according to an embodiment of the present disclosure, a modulized two-in-one semiconductor package is provided, so that the total size and/or thickness of the module can be reduced, the cost for the additional elements can be decreased, and the cost for manufacturing the module can also be decreased.

However, in some circumstances, the introduction of the fillers 104 in the encapsulant 103 may adversely promote the scattering of the incoming light. For example, in the case that the electronic device 102 is an optical detector, when stray light incidents from the lateral sides of the semiconductor package 100, the stray light can be scattered by the fillers 104 so that the stray light can be reflected in every direction. In this situation, it is more possible that the stray light can be reflected into the light detecting area of the optical detector, which usually locates on the top surface of the optical detector, causing the undesired stray lights being detected by the optical detector.

Thus, to address the aforesaid side effect, according to some embodiments of the present disclosure, a lid that surrounds the electronic device 102 may be further provided on the substrate so as to prevent the undesired stray lights from being detected.

Figure 2A:
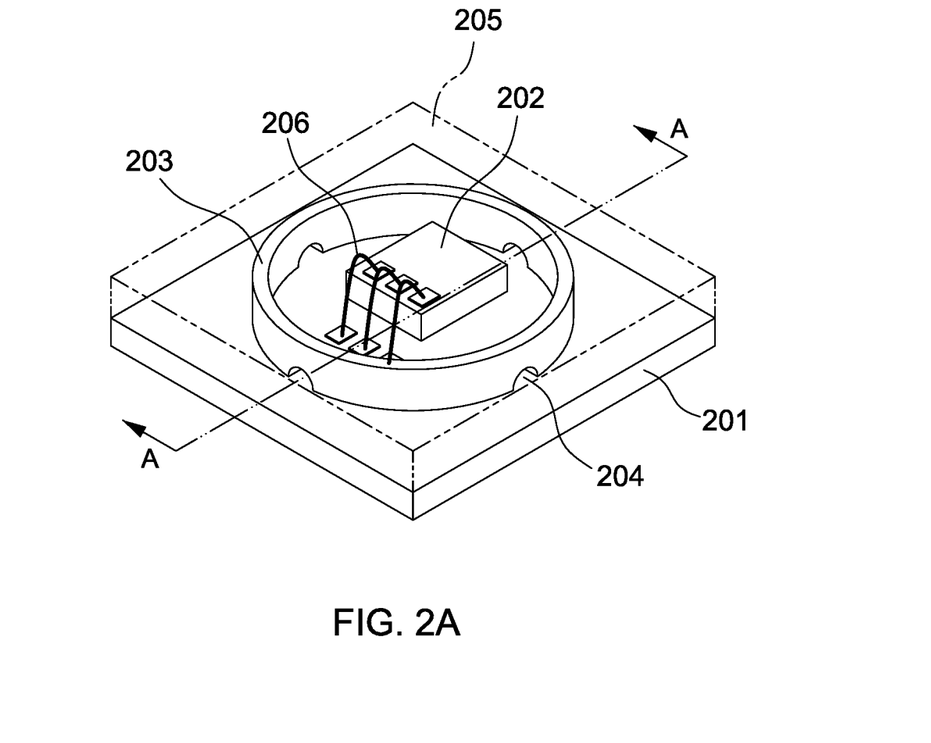
FIG. 2A illustrates a schematic perspective view of a semiconductor package according to some embodiments of the present disclosure.
Figure 2B:
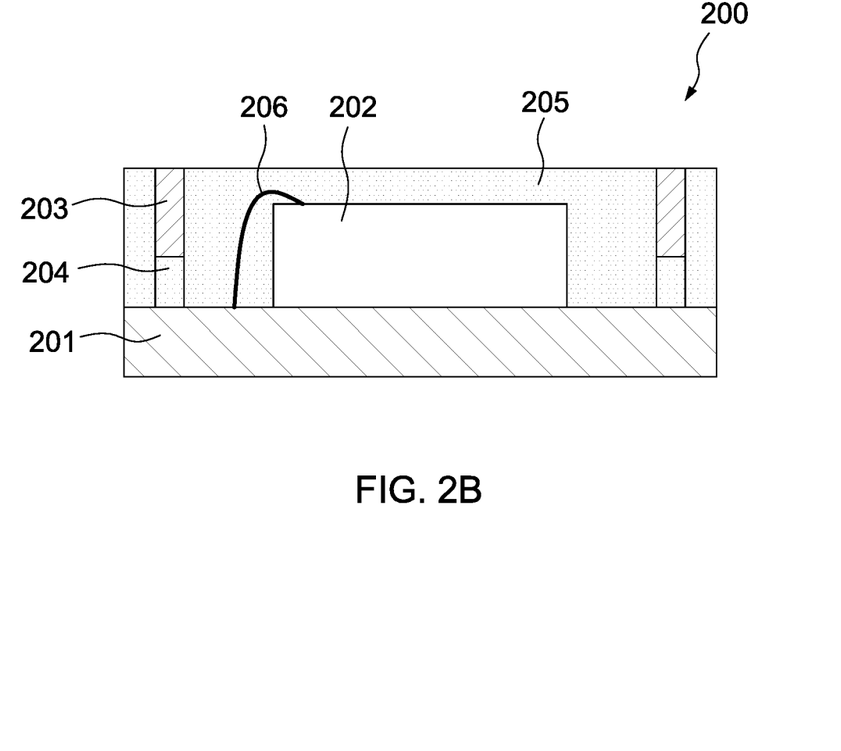
FIG. 2B illustrates a schematic cross sectional view of a semiconductor package viewing from interface AA of FIG. 2A, according to some embodiments of the present disclosure.

Referring to FIG. 2A, FIG. 2A illustrates a schematic perspective view of a semiconductor package 200 according to some embodiments of the present disclosure. FIG. 2B illustrates a cross sectional view of the semiconductor package 200 viewing from interface AA of FIG. 2A, according to some embodiments of the present disclosure. In FIGS. 2A and 2B, the semiconductor package 200 includes a substrate 201, an electronic device 202, a lid 203, at least one opening 204 on the lid 203, an encapsulant 205, and a bonding wire 206. As shown in FIGS. 2A and 2B, the electronic device 202 and the lid 203 are disposed on the substrate 201, the lid 203 surrounds the electronic device 202 and the bonding wire 206, and the encapsulant 205 is formed over the substrate 201 and encapsulates the electronic device 202, the lid 203, and the bonding wire 206.

As shown in FIG. 2A, the lid 203 is in a circular ring shape. As shown in FIGS. 2A and 2B, the lid 203 has at least one notch, and the at least one opening 204 is defined by the at least one notch on the lid 203 and the upper surface of the substrate 201. As shown in FIG. 2A, the at least one opening 204 is in semicircular shape with a side defined by the substrate. As shown in FIGS. 2A and 2B, the encapsulant 205 is in contact with the lid 203 through both an inner surface and an outer surface of the lid 203, and a top surface of the lid 203 is leveled with a top surface of the encapsulant 205. As shown in FIGS. 2A and 2B, the height of the at least one opening 204 measured from the substrate to a topmost point of the at least one opening 204 is smaller than a thickness of the electronic device 202. In some embodiments, the height of the at least one opening 204 is less than two-third of the thickness of the electronic device 202. As shown in FIGS. 2A and 2B, the boding wire 206 is connected between the electronic device 202 and the substrate 201. As shown in FIGS. 2A and 2B, the height of the lid 203 is greater than the thickness of the electronic device 202, and can be greater than a loop height of the bonding wire 206.

In FIGS. 2A and 2B, the lid 203 may be used to prevent the stray light incidents from the lateral sides of the semiconductor package 200 and further transmitting to light detecting area, which usually locates on the top surface of the electronic device 202 when the electronic device 202 is an optical detector. As mentioned above, in FIG. 2A, the lid 203 is in a circular ring shape. The curved surfaces of the lid 203 reflect substantial stray light impinging from the lateral sides of the semiconductor package 200. In some embodiments, the lid 203 may be composed of material of dark colors. In some embodiments, the lid 203 may include a material having a high optical density (OD) value. In some embodiments, the lid 203 may include liquid crystal polymers (LCP). In some embodiments, the lid 203 may be in any ring shapes which include a curved outer surface and/or a curved inner surface. In some embodiments, the lid 203 may be in any other suitable shapes.

In some embodiments, the at least one opening 204 includes two or more openings 204, as exemplified in FIG. 2A. In some embodiments, the at least one opening 204 includes four openings 204. In some embodiments, the at least one opening 204 is proximal to the substrate. In some other embodiments, the at least one opening 204 can be located in the middle of the lid 203 without reaching the substrate 201. In some embodiments, the at least one opening 204 can be circular or in any shapes.

In some embodiments, the surface of the substrate 201 may be processed through a treatment to weaken light reflection. In some embodiments, the treatment may be dark-color painting or sand blasting. In some embodiments, the substrate 201 comprises a roughened surface weakening light reflection. In some embodiments, the electronic device 202 may include an optical emitter or an optical detector. In some embodiments, the encapsulant 205 includes a molding compound. In some embodiments, the encapsulant 205 includes a material which allows transmission of visible light and absorbs near infra-red (NIR) light. In some embodiments, the encapsulant 205 includes a material allowing transmission of light with a wavelength in a rage from about 380 nm to 720 nm and preventing transmission of light with a wavelength in a range of from about 720 nm to 1000 nm. For example, the encapsulant 205 may be composed of polymeric materials having an absorption band in a wavelength range of from about 720 nm to 1000 nm. In some embodiments, the encapsulant 205 may include epoxy. In some embodiments, the encapsulant 205 may include epoxy with a refractive index within a range of from about 1.4 to 1.8.

FIGS. 3A-3D each illustrates a schematic cross-sectional view of a structure at various fabrication stages using a method for manufacturing a semiconductor package 200 according to some embodiments of the present disclosure.

Figure 3A:
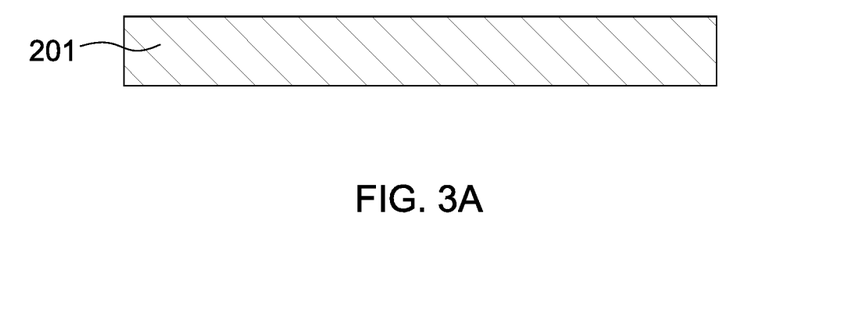
FIG. 3A, FIG. 3B, FIG. 3C, and FIG. 3D each illustrates a schematic cross-sectional view of a structure at various fabrication stages using a method for manufacturing a semiconductor package according to some embodiments of the present disclosure.
Figure 3B:
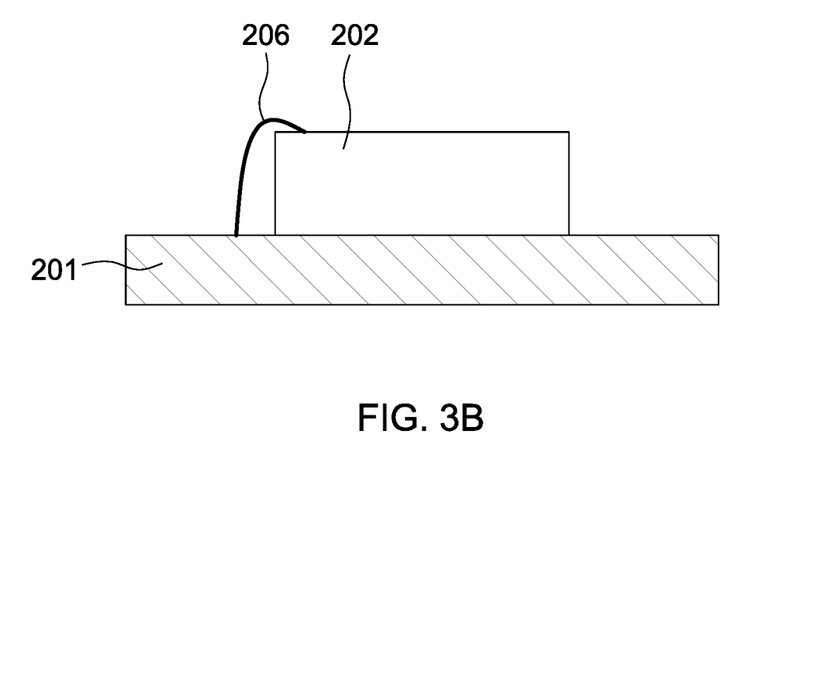
Figure 3C:
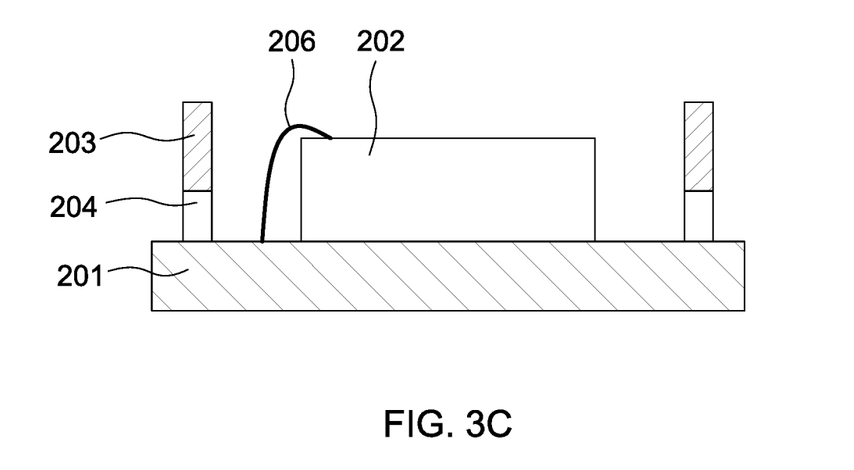

Referring to FIG. 3A, a substrate 201 is provided. Referring to FIG. 3B, an electronic device 202 is disposed on and attached to the substrate 201, and a bonding wire 206 is provided to connect the electronic device 202 and the substrate 201. Referring to FIG. 3C, a lid 203 having at least one opening 204 is disposed on and attached to the substrate 201 and surrounds the electronic device 202.

Figure 3D:
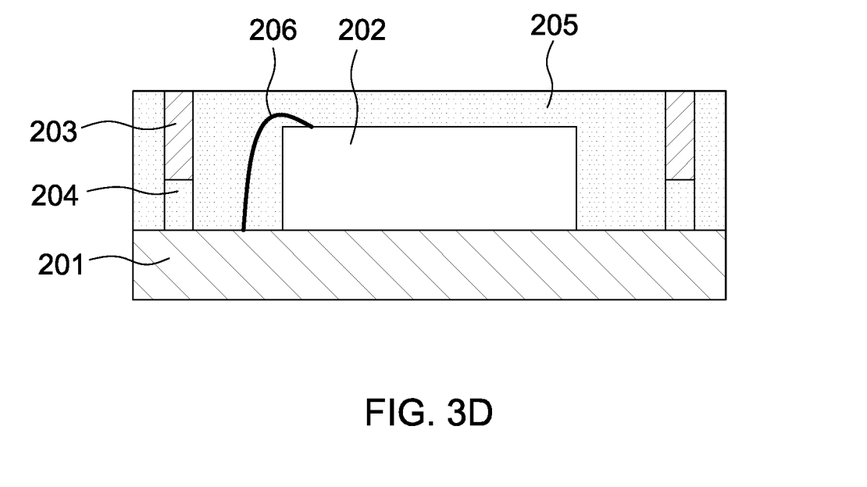

In FIG. 3D, the encapsulant 205 is formed over the substrate 201 by a molding operation so as to encapsulates the electronic device 202 and the lid 203. In some embodiments, the encapsulant 205 is introduced into the inner side of the lid 203 through the at least one opening 204. Under the condition that two or more openings 204 are formed on the lid 203, one of the openings 204 allows the air to be evacuated out of the lid 203 during the molding operation so as to facilitate the flowability of the mold flow. The at least one opening 204 may be circular or semicircular, which leads to better flow of the encapsulant 205 through the at least one opening 204 during the molding process. After the molding process, the encpasulant 205 fully encapsulates the electronic device 202 and the lid 203. That is, the encapsulant 205 is formed to be in contact with the lid 203 through both an inner surface and an outer surface of the lid 203. In some embodiments, a mold cap (not shown) may be disposed against a top surface of the lid 203 prior to applying the mold flow, so that after the molding operation, the upper surface of the encapsulant 205 is leveled with the upper surface of the lid 203. According to some embodiments of the present disclosure, the at least one opening 204 is defined by at least one notch on the lid 203 and the upper surface of the substrate 201.

The lid 203 can be in any shape. However, if the lid is in a rectangular ring shape, for example, the encapsulant 205 may not fully fill the inner side of the lid 203 during the molding process, and air vacancies may be formed at the corners of the lid 203. According to some embodiments of the present disclosure, the lid is 203 in a circular ring shape so that the encapsulant 205 can flow into and fully fill the inner side of the lid 203 without forming air vacancies in the corners. The height of the lid 203 must be at least greater than the thickness of the electronic device 202 and the loop height of the boding wire 206 so that the encapsulant 205 can fully encapsulate the electronic device 202 and the boding wire 206. Also, the height of the lid 203 must be greater than the thickness of the electronic device 202 and the loop height of the boding wire 206 so as to prevent the electronic device 202 and the boding wire 206 from being suppressed by the mold cap (not shown) disposed against the upper surface of the lid 203 before the molding process.

Figure 4:
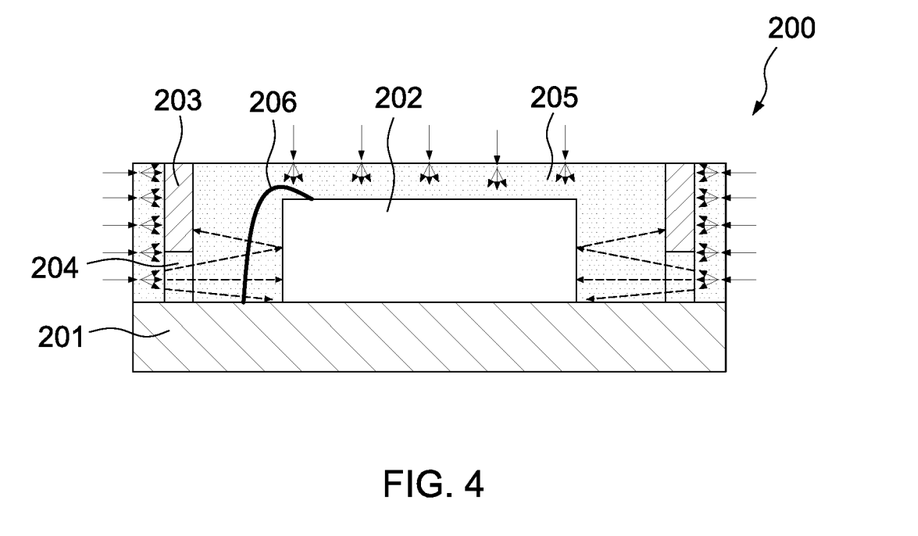
FIG. 4 illustrates a schematic cross sectional view of a semiconductor package manufactured through the method shown in FIGS. 3A to 3D according to some embodiments of the present disclosure.

FIG. 4 illustrates a schematic cross sectional view of a semiconductor package 200 manufactured through the process shown in FIGS. 3A to 3D according to some embodiments of the present disclosure. The semiconductor package 200 shown in FIG. 4 is substantially identical to that in FIG. 2 but with additional annotation of the rays of light. In FIG. 4, the light incidents from a direction perpendicular to the upper surface of the electronic, i.e., normal light, is refracted by the encapsulant 205 and some of them may be received by the detecting area on the top surface of the electronic device 202.

On the other hand, as shown in FIG. 4, a substantial portion of the stray lights incident from the lateral sides of the package may be barred or absorbed by the lid 203, so that the stray lights would not be received by the detecting area on the top surface of the electronic device 202. As illustrated in FIG. 4, a portion of the lateral stray lights incident from the lateral sides of the semiconductor package 200 may pass through the opening 204. Some stray lights entered may travel to the detecting area located at the upper surface of the substrate 201 through multiple reflections. As mentioned above, since the surface of the substrate 201 may be processed through a treatment to reduce light reflection, a substantial portion of the stray light impinging onto the substrate 201 may be absorbed. Some stray light entering the at least one opening 204 may impinge on the lateral surfaces of the electronic device 202 and then be reflected back to exit the semiconductor package 200 through the at least one opening 204. Some stray light that enters the at least one opening 204 may impinge on the lateral surfaces of the electronic device 202 and then be reflected to an inner sidewall of the lid along an oblique direction. Only limited amount of the stray light can make their way to the detecting area on the top surface of the electronic device 202 through multiple reflection.

As the encapsulant 205 itself can be used as an integrated optical filter for the electronic device 202, there is no need for an additional optical filter to be stacked on the semiconductor package 200. As the lid 203 is also integrated in the semiconductor package, there is no need for an additional lid disposed outside the semiconductor package 200. Thus, according to an embodiment of the present disclosure, a modulized two-in-one semiconductor package is provided, so that the total size and/or thickness of the module can be reduced, the cost for the additional elements can be decreased, and the cost for manufacturing the module can also be decreased.

Figure 5A:
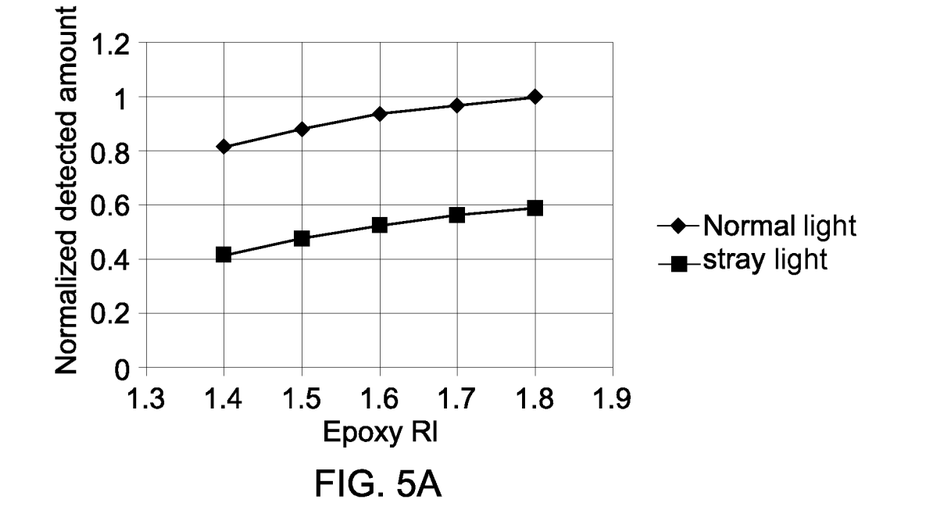
FIG. 5A is a diagram showing the normalized amount of light detected with respect to the refractive index (RI) of the epoxy according to some embodiments of the present disclosure.
Figure 5B:
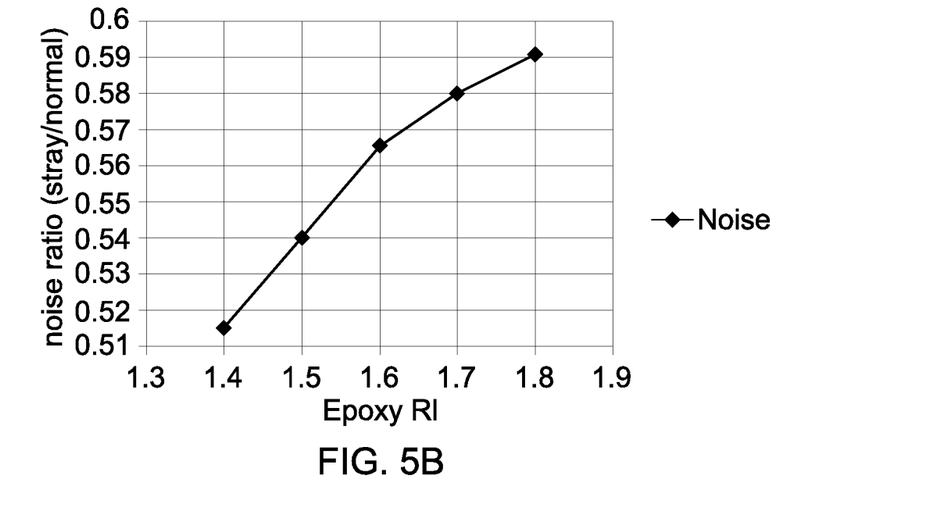
FIG. 5B is a diagram showing the noise ratio with respect to the refractive index (RI) of the epoxy according to some embodiments of the present disclosure.

FIG. 5A is a diagram showing the normalized amount of light detected with respect to the refractive index (RI)) of the encapsulant, which can be an epoxy in this case, for normal lights and stray lights, respectively, according to some embodiments of the disclosure. In FIGS. 5A and 5B, refractive indices of the epoxy are selected within a range of 1.4 to 1.8. As can be seen in FIG. 5A, when the RI of the encapsulant is 1.8, the amount of the normal lights detected is maximized. As the refractive index of the epoxy decreases, the amount of the normal lights and the stray lights detected both decrease.

FIG. 5B is a diagram showing the noise ratio with respect to the refractive index (RI) of the epoxy. The noise ratio is defined to be the ratio of the amount of the stray lights detected to the amount of normal lights detected. As can be seen in FIG. 5B, when the RI of the epoxy is 1.4, the noise ratio is between 0.51 and 0.52, which is more desirable according to some embodiments of the present disclosure. That is, when an epoxy with the RI of 1.4 is used in the present disclosure, desired noise ratio can be obtained while maintaining acceptable amount of the normal lights detected.

Figure 6:
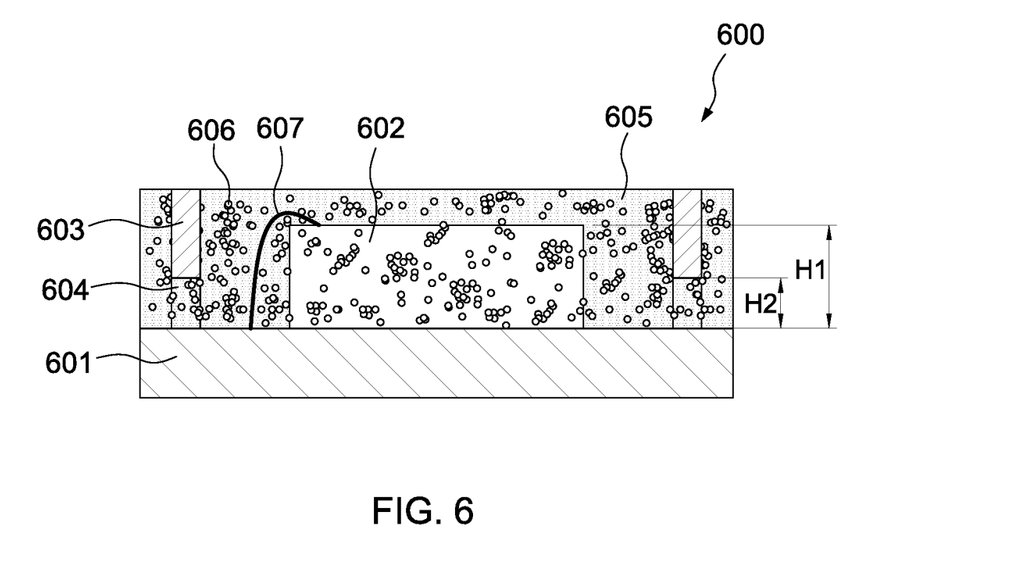
FIG. 6 illustrates a schematic cross-sectional view of a semiconductor package according to some embodiments of the present disclosure.

FIG. 6 illustrates a schematic cross-sectional view of a semiconductor package 600 according to some embodiments of the present disclosure. The semiconductor package 600 includes a substrate 601, an electronic device 602, a lid 603, at least one opening 604 on the lid 603, an encapsulant 605, fillers 606, and a bonding wire 607. As shown in FIG. 6, the electronic device 602 and the lid 603 is disposed on the substrate 601, the lid 603 surrounds the electronic device 602 and the bonding wire 607, and the encapsulant 605 is formed over the substrate 601 and encapsulates the electronic device 602, the lid 603, and the bonding wire 607. The fillers 606 are uniformly distributed in the encapsulant 605.

The semiconductor package 600 can be obtained through the manufacturing process shown in FIGS. 3A-3D by replacing the encapsulant 205 in FIG. 3D with an encapsulant 605 including the fillers 606 uniformly distributed therein. The encapsulant 605 can be substantially the same material as the encapsulant 205. The fillers 606 can be substantially the same material as the fillers 104 mentioned above.

In some embodiments, the electronic device 602 may be an optical detector or an optical emitter. The encapsulant 605 itself can be used as an optical filter to prevent light of undesired wavelength from interacting with the electronic device 602. The fillers 606 can be used as an optical diffuser for diffusing incoming lights prior to their entering to the electronic device 602. Thus, the combination of the encapsulant 605 and the fillers 606 can be used as an integrated optical filter and optical diffuser for the electronic device 602. To obtain desired light diffusing properties, the fillers 606 may occupy 30% to 70% of a volume of the encapsulant 605.

As the combination of the encapsulant 605 and the fillers 606 can be used as an integrated optical filter and optical diffuser for the electronic device 602, there is no need for an additional optical filter and/or an additional optical diffuser to be stacked on the semiconductor package 600. As the lid 603 is also integrated in the semiconductor package 600, there is no need for an additional lid disposed outside the semiconductor package 600. Thus, according to an embodiment of the present disclosure, a modulized three-in-one semiconductor package is provided, so that the total size and/or thickness of the module can be reduced, the cost for the additional elements can be decreased, and the cost for manufacturing the module can also be decreased.

FIG. 6 also shows the thickness of the electronic device 602 and the height of the at least one opening 604. In FIG. 6, the thickness of the electronic device 602 is denoted as H1 and the height of the at least one opening 604 is denoted as H2. Theoretically, in order to prevent most of the stray lights from passing through the at least one opening 604, the size of the at least one opening 604 shall be the smaller the better. However, the opening should not be too small, otherwise, it may unduly hinder the entering of the mold flow when performing the molding operation. In addition, the height H2 of the at least one opening 604 can be at least greater than the diameters of the fillers 606, which can be within a range of from 1 μm to 10 μm, so that the fillers 606 in the encapsulant 605 can also enter the lid through the at least one opening 604.

Figure 7:
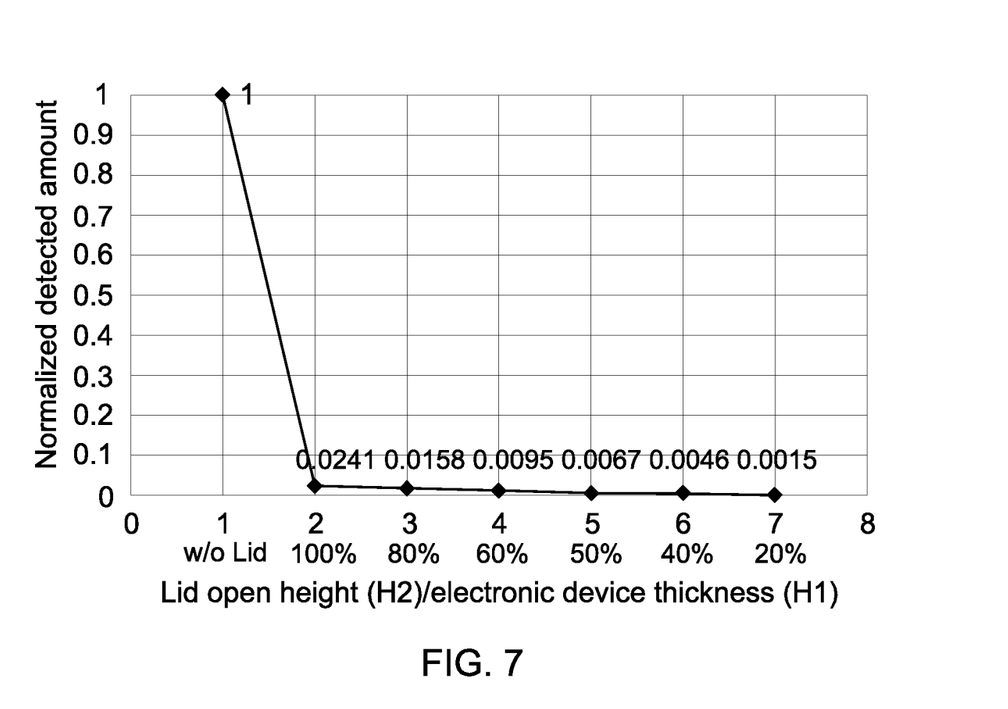
FIG. 7 is a diagram showing the normalized amount of the stray light detected with respect to the ratio of the height of the opening to the thickness of the electronic device, according to some embodiments of the present disclosure.

FIG. 7 is a diagram showing the normalized amount of the stray light detected with respect to the ratio of H2 to H1. As can be seen in FIG. 7, if H1 is fixed, the smaller the opening, the less stray light can be detected. In order to obtain a desired signal-to-noise ratio, which is around 20 dB according to the present disclosure, and also enable the encapsulant 605 and the fillers 606 passing through the at least one opening 604, the ratio of H2 to H1 is selected to be around 60%. FIG. 7 shows a decrease of amount of the stray lights from a normalized value of 1 to less than 0.01 when the ratio of H2 to H1 is around 60%, and thus an industrial acceptable signal-to-noise ratio of 20 dB can be achieved. That is to say, the desired height of the at least one opening 604 can be less than two-third of the thickness of the electronic device 602.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for the purpose of illustration only, and that practical implementations of the structures described herein can be spatially arranged in any orientation or manner, provided that the merits of the embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood to flexibly include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
   a substrate;
   an electronic device disposed on the substrate;
   an encapsulant formed over the substrate and encapsulating the electronic device;
   a plurality of fillers in the encapsulant, configured to diffuse light interacting with the electronic device, wherein the plurality of fillers occupy 30% to 70% of a volume of the encapsulant; and
   a lid on the substrate, surrounding the electronic device and in contact with the encapsulant, wherein the lid has an opening with a side defined by the substrate;
   wherein the plurality of fillers include particles, each particle having a diameter within a range of from 1 μm to 10 μm; and
   wherein a height of the opening measured from the substrate to a topmost point of the opening is at least greater than the diameter of each of the particles of the plurality of fillers.

2. The semiconductor package of claim 1, wherein the substrate comprises a roughened surface weakening light reflection.

3. The semiconductor package of claim 1, wherein the encapsulant includes a material preventing transmission of light with a wavelength in a range of from 720 nm to 1000 nm.

4. The semiconductor package of claim 1, wherein a refractive index of the encapsulant is within a range of from 1.4 to 1.8.

5. The semiconductor package of claim 1, wherein the plurality of fillers include a light scattering material.

6. The semiconductor package of claim 1, wherein the lid includes a curved outer surface.

7. The semiconductor package of claim 1, wherein the height of the opening is smaller than a thickness of the electronic device.

8. The semiconductor package of claim 7, wherein the height of the opening is less than two-third of the thickness of the electronic device.

9. The semiconductor package of claim 1, wherein the encapsulant is in contact with the lid through both an inner surface and an outer surface of the lid.

10. The semiconductor package of claim 1, wherein the electronic device comprises an optical detector.

* * * * *